United States Patent
Kalinichenko

(10) Patent No.: US 11,239,828 B2
(45) Date of Patent: Feb. 1, 2022

(54) METHOD FOR CARRYING OUT A MORPHING PROCESS

(71) Applicant: ASK INDUSTRIES GMBH, Niederwinkling (DE)

(72) Inventor: Victor Kalinichenko, Viechtach (DE)

(73) Assignee: ASK INDUSTRIES GMBH, Niederwinkling (DE)

( * ) Notice: Subject to any disclaimer, the term of this patent is extended or adjusted under 35 U.S.C. 154(b) by 0 days.

(21) Appl. No.: 16/756,392

(22) PCT Filed: Sep. 14, 2018

(86) PCT No.: PCT/EP2018/074981
§ 371 (c)(1),
(2) Date: Apr. 15, 2020

(87) PCT Pub. No.: WO2019/076554
PCT Pub. Date: Apr. 25, 2019

(65) Prior Publication Data
US 2021/0194463 A1 Jun. 24, 2021

(30) Foreign Application Priority Data
Oct. 16, 2017 (DE) .................... 10 2017 124 046.2

(51) Int. Cl.
| | | |
|---|---|---|
| H03H 17/02 | (2006.01) | |
| H03F 3/183 | (2006.01) | |
| H03G 3/30 | (2006.01) | |
| H04H 60/04 | (2008.01) | |
| H04R 3/04 | (2006.01) | |
| H03H 17/00 | (2006.01) | |

(52) U.S. Cl.
CPC ............ H03H 17/02 (2013.01); H03F 3/183 (2013.01); H03G 3/3005 (2013.01); H04H 60/04 (2013.01); H04R 3/04 (2013.01); H03F 2200/03 (2013.01); H03H 2017/009 (2013.01); H03H 2017/0081 (2013.01); H04R 2499/13 (2013.01)

(58) Field of Classification Search
None
See application file for complete search history.

(56) References Cited

U.S. PATENT DOCUMENTS

| | | | | |
|---|---|---|---|---|
| 8,976,979 | B2 * | 3/2015 | Crockett | G11B 20/10527 |
| | | | | 381/98 |
| 9,565,508 | B1 * | 2/2017 | Skovenborg | H04S 3/006 |
| 10,116,473 | B1 * | 10/2018 | Dhananjay | H04L 25/4927 |

(Continued)

FOREIGN PATENT DOCUMENTS

| | | |
|---|---|---|
| DE | 10 2008 023919 | 11/2008 |
| WO | 03/009469 | 1/2003 |

OTHER PUBLICATIONS

International Search Report issued in International Patent Application No. PCT/EP2018/074981, dated Jan. 2, 2019, with an English translation thereof.

(Continued)

*Primary Examiner* — Qin Zhu
(74) *Attorney, Agent, or Firm* — Greenblum & Bernstein, P.L.C.

(57) ABSTRACT

Method for carrying out a morphing process, wherein an output parameter relating to the output of an audio signal outputted into an interior via an audio output device is changed.

11 Claims, 3 Drawing Sheets

(56) References Cited

U.S. PATENT DOCUMENTS

Figure 1:
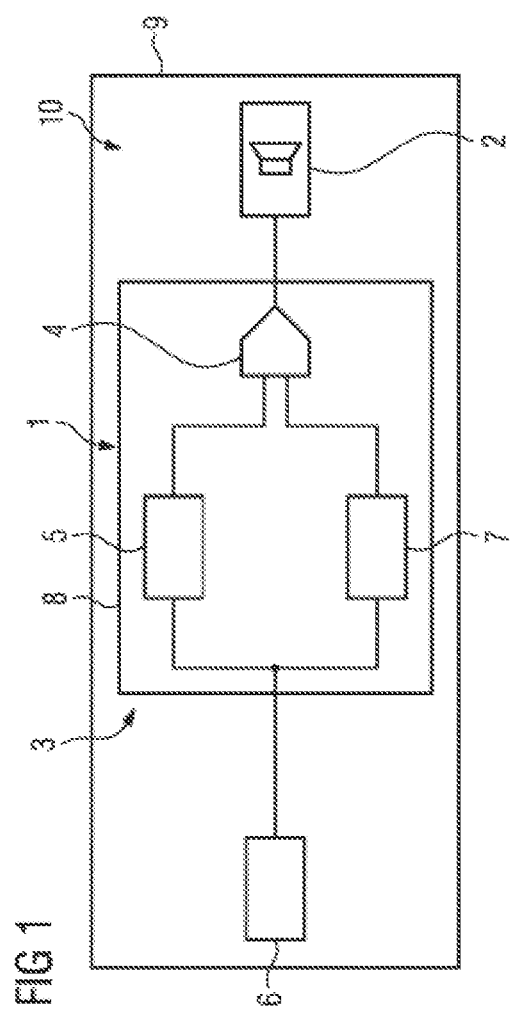

| | | | |
|---|---|---|---|
| 2004/0179700 A1 | 9/2004 | Neumann et al. | |
| 2007/0280485 A1* | 12/2007 | Villemoes | H04S 7/30 381/22 |
| 2008/0310654 A1* | 12/2008 | Jambor | H03G 5/04 381/120 |
| 2009/0136063 A1* | 5/2009 | Xiang | H04S 7/30 381/119 |
| 2011/0103593 A1 | 5/2011 | Sutharsan | |
| 2012/0063614 A1* | 3/2012 | Crockett | H03G 5/165 381/98 |
| 2012/0213375 A1* | 8/2012 | Mahabub | H04S 5/00 381/17 |
| 2014/0205110 A1* | 7/2014 | Hera | G10K 15/02 381/86 |
| 2015/0055807 A1* | 2/2015 | Stepputat | H04S 5/02 381/302 |
| 2018/0167731 A1* | 6/2018 | Ohta | B60R 11/02 |

OTHER PUBLICATIONS

Written Opinion issued in International Patent Application No. PCT/EP2018/074981, dated Jan. 2, 2019, with an English translation thereof.

* cited by examiner

METHOD FOR CARRYING OUT A MORPHING PROCESS

The invention relates to a method for carrying out a morphing process, wherein an output parameter relating to the output of an audio signal outputted into an interior, in particular of a motor vehicle, via an audio output device is changed.

Morphing processes and corresponding methods for carrying out morphing processes are in principle known. In morphing processes of this type, one or more output parameters relating to the output of an audio signal via an audio output device are changed in a targeted manner.

Morphing processes of this type are carried out, for example, when an output setting, defined by corresponding output parameters, of an audio output device is changed. By way of example, in connection with an acoustic audio output device of a motor vehicle, reference is made to a change in the position of the sweet spot, in other words the region of the interior of the motor vehicle in which the outputted audio signal can be perceived optimally (or as optimally as possible). A corresponding change in the position of the sweet spot may occur, for example, if a driver-optimized output mode is changed to a non-driver-optimized, for example passenger-optimized, output mode, and the sweet spot is thus changed from a driver-oriented focus to a non-driver-oriented, for example passenger-optimized, focus, or vice versa.

Morphing processes of this type are implemented by way of morphing devices, which are equipped with suitable morphing algorithms and implemented in hardware and/or in software and which typically comprise a computational processor device and a data storage device. Morphing devices of this type typically form components, implemented in hardware and/or in software, of corresponding audio output devices.

In the context of carrying out morphing processes, known morphing devices typically need a comparatively high computational processor power and a comparatively high storage requirement. The known morphing devices thus have the potential for improvement as regards efficient use of the computational processor power and of the storage requirement.

The object of the invention is to specify an improved method, in particular as regards the possibility of efficient use of the computational processor power and/or of the storage requirement, for carrying out a morphing process.

The object is achieved by a method for carrying out a morphing process according to claim 1. The claims dependent thereon relate to advantageous embodiments of the method. The object is further achieved by a device according to claim 11.

The method described herein serves in general to carry out a morphing process. In a morphing process of this type, at least one output parameter relating to the output of an audio signal outputted into an interior via an audio output device is changed. By way of corresponding output parameters, output settings of the audio output device are typically defined, in such a way that, in the context of carrying out a morphing process, corresponding output settings of the audio output device are typically also changed. Thus, in the context of carrying out a morphing process, a first output setting, defined by at least one first output parameter, of an audio output device can be changed to a second output setting, defined by at least one second output parameter different from the first output parameter, of the audio output device. In all cases, the fact that morphing processes of this type are being carried out should be imperceptible or barely perceptible to a listener.

A specific example of the change in output settings of this type that is brought about by a morphing process is a change in a first output setting, which is defined by at least one first output parameter and allows a 3D listening experience (3D sound or 3D surround), to a second output setting, which is defined by at least one second output parameter and, like actually attending a concert, allows a particularly intense listening experience (live sound or live surround). A further specific example of the change in output settings of this type that is brought about by a morphing process is a change in the position of the sweet spot, in other words the region of the interior, in particular of a motor vehicle, in which the outputted audio signal can be perceived optimally (or as optimally as possible). For an example application of a morphing process in the field of motor vehicle technology, a corresponding change in the position of the sweet spot may occur, for example, when a driver-optimized output mode is changed to a non-driver-optimized, for example passenger-optimized, output mode, and the sweet spot is thus changed from a driver-oriented focus to a non-driver-oriented, for example passenger-optimized, focus, or vice versa. Naturally, alongside the stated examples, other changes brought about by a morphing process in output settings of his type are conceivable.

An audio output device of this type may specifically be, for example, a multichannel audio output device, in other words an audio output device that has a plurality of, in other words at least two, acoustic audio output elements or channels. The audio signal outputable or outputted via an audio output device, describing for example a piece of music, is provided via an audio signal source device ("signal source"); this may be any of the data or sound carrier devices assignable or assigned to the audio output device, for example a sound carrier playback appliance (CD player, record player etc.), a (mobile) terminal (smartphone, tablet PC, laptop, etc.), a hard disk, a memory card, a CD, a network device (online radio, streaming services, etc.), etc.

The audio output device may be installable or installed in a motor vehicle so as to output audio signals into an interior of the motor vehicle, in particular into the passenger compartment or into at least one particular region of the passenger compartment. Alternatively, the audio output device, for example as a component of a multimedia device (home theater), may be installable or installed in an interior of a building so as to output audio signals into an interior of the building or into at least one particular region of the interior of the building. As a further alternative, the audio output device may also be installable or installed in a mobile terminal so as to output audio signals into an interior or into at least one particular region of an interior. The above statements on outputting audio signals into an interior are naturally also transferable to outputting audio signals into an exterior or into at least one particular region of an exterior.

The implementation of the method, in other words carrying out morphing processes of this type in accordance with the invention, takes place via a morphing device, which is equipped with suitable morphing algorithms and implemented in hardware and/or in software as a hardware and/or software component of the audio output device. The morphing device typically comprises a computational processor device ("processor") and a data storage device ("store").

The steps, proceeding in accordance with the method, of the method described herein are described in greater detail in the following:

In a first step, an audio signal provided by an audio signal source device is supplied to an audio mixing device via an FIR filter device comprising a plurality of FIR coefficients (filter coefficients). Thus, in the first step, an audio signal provided by an audio signal source device is supplied, via an FIR filter device (FIR filter) comprising an FIR algorithm comprising a plurality of FIR coefficients, in other words a filter device that is known per se from digital signal processing, comprising a finite impulse response filter, to an audio mixing device, in other words to an audio mixing device that is known per se for mixing audio signals. In the first step the audio signal is supplied to the audio mixing device 100%, in other words exclusively or entirely, via the FIR filter device.

In a second step following the first step, a first transfer function is applied, according to which the supply of the audio signal via the FIR filter device is gradually reduced from 100% to 0% and the supply of the audio signal via a signal processing device connected in parallel with the FIR filter device is conversely gradually increased from 0% to 100%. Thus, in the second step, a first transfer function or transfer prescription is applied, according to which the supply of the audio signal to the audio mixing device via the FIR filter device is gradually reduced from 100% to 0% and the supply of the audio signal to the audio mixing device via a signal processing device connected in parallel with the FIR filter device is conversely gradually increased from 0% to 100%. At the start of the second step, the audio signal is thus supplied to the audio mixing device 100% via the FIR filter device, and at the end of the second step, the audio signal is thus supplied to the audio mixing device 100% via the signal processing device connected in parallel with the FIR filter device. Between the start and end of the second step, the audio signal is supplied both via the FIR filter device and via the signal processing device, at particular, temporally varying percentage proportions. The respective percentage proportions are determined by the measure, defined by the first transfer function, whereby the supply of the audio signal to the audio mixing device via the FIR filter device is gradually reduced from 100% to 0% and the supply of the audio signal to the audio mixing device via the signal processing device is conversely gradually increased from 0% to 100%. The reduction in the supply of the audio signal to the audio mixing device via the FIR filter device and the increase in the supply of the audio signal to the audio mixing device via the signal processing device may optionally take place (temporally) in parallel.

A linear or non-linear function may be used as the first transfer function. The reduction and increase in the supply of the audio signal via the FIR filter device or via the signal processing device respectively may thus take place linearly or non-linearly.

Typically, a device having less computational power and/or less storage than the FIR filter device is used as a signal processing device connected in parallel with the FIR filter device. A device should be used that does not bring about any acoustic effects that may be perceived as obtrusive by a listener when a morphing process is carried out. Specifically, for example an amplification device or an IIR filter device, in other words an infinite impulse response filter device, which in particular comprises one or more biquadratic portions ("biquads"), may be used as a signal processing device.

In a third step following the second step, at least some of the FIR coefficients of the FIR filter device are changed, in particular switched, while supplying the audio signal via the signal processing device. Thus, in the third step, at least some of the FIR coefficients of the FIR filter device, in other words potentially all FIR coefficients of the FIR filter device, are changed. Changing the FIR coefficients of the FIR filter device should be understood to mean in particular updating the FIR coefficients of the FIR filter device. The change in the FIR coefficients of the FIR filter device takes place while the audio signal is being supplied to the audio mixing device via the signal processing device. The FIR coefficients of the FIR filter device are thus changed when the audio signal is being supplied to the audio mixing device via the signal processing device rather than via the FIR filter device.

The change in at least some of the FIR coefficients may take place by loading or reloading FIR coefficients from a storage device, in particular a non-volatile data storage device, for example a flash memory device, or by switching the FIR coefficients, in particular of an FIR coefficient set comprising a plurality or all of the FIR coefficients to be changed, for FIR filter coefficients stored in advance in a storage device, in particular a non-volatile data storage device, in particular for an FIR coefficient set comprising a plurality or all of the FIR coefficients to be changed. The change in at least some of the FIR coefficients typically only occurs once the first transfer function is fully completed, in other words once the audio signal is being supplied to the audio mixing device entirely via the signal processing device. In this way, the risk of the occurrence of undesired acoustic interference signals can be reduced.

During the change in at least some of the FIR coefficients, in some circumstances a temporary interruption to the (real-time) processing of the provided audio signal may occur. The interruption to the (real-time) processing of the provided audio signal typically only takes place in the FIR filter device, and not in the signal processing device. The interruption to the (real-time) processing of the provided audio signal thus leads to a (negative) influence on the reproduction of the audio signal. If a corresponding interruption to the (real-time) processing of the provided audio signal occurs, it may potentially be advisable also to empty the delay line of the FIR filter device, so as to avoid reproduction of the signal that was stored in the delay line, before the interruption to the real-time processing of the provided audio signal, once the interruption to the (real-time) processing of the provided audio signal is ended and the (real-time) processing of the provided audio signal is resumed.

In a fourth step following the third step, a second transfer function (reverse transfer function) is applied, according to which the supply of the audio signal via the signal processing device is gradually reduced from 100% to 0% and the supply of the audio signal via the FIR filter device is conversely gradually increased from 0% to 100%, wherein the audio signal is (thenceforth) supplied via the FIR filter device on the basis of the changed FIR coefficients of the FIR filter device. Thus, in the fourth step, a second transfer function or transfer prescription, in particular inverse to the first transfer function, is applied, according to which the supply of the audio signal via the signal processing device is gradually reduced (back) from 100% to 0% and the supply of the audio signal via the FIR filter device is conversely gradually increased (back) from 0% to 100%. At the start of the fourth step, the audio signal is thus supplied to the audio mixing device 100% via the signal processing device, and at the end of the fourth step, the audio signal is thus (again) supplied to the audio mixing device 100% via the FIR filter device. Between the start and end of the fourth step, the audio signal is supplied both via the signal processing device and via the FIR filter device, at particular, temporally varying percentage proportions. The respective percentage proportions are determined by the measure, defined by the second transfer function, whereby the supply of the audio signal to the audio mixing device via the signal processing device is gradually reduced from 100% to 0% and the supply of the audio signal to the audio mixing device via the FIR filter device is conversely gradually increased from 0% to 100%. The reduction in the supply of the audio signal to the audio mixing device via the signal processing device and the increase in the supply of the audio signal to the audio mixing device via the FIR filter device may optionally take place (temporally) in parallel.

A linear or non-linear function may be used as the second transfer function. The reduction and increase in the supply of the audio signal via the signal processing device and via the FIR filter device respectively may thus take place linearly or non-linearly.

The method enables efficient use of the computational processor power and storage requirement of the morphing device. This occurs in particular as a result of the described varying supply of the audio signal to the audio mixing device via the FIR filter device and via the signal processing device connected in parallel therewith and as a result of the change that occurs in the meantime, in other words in the third step, in the FIR coefficients of the FIR filter device. As a result of the method, in connection with carrying out a morphing process, the signal processing device that is connected in parallel with the FIR device, and that can thus be considered a bypass, creates an alternative signal path around the FIR filter device.

It is conceivable for the parameters applied in the context of applying the reverse transfer function (cf. fourth step) to take place as a function of properties of the FIR filter device to be morphed. For example, it is possible for the response properties, in particular the magnitude response, of the signal processing device, for example an IIR filter device, to be adapted to or aligned with the response properties, in particular the magnitude response, of the FIR filter device.

The method may also be applied using a plurality of FIR filter devices connected in parallel and audio mixing devices respectively assigned thereto. In this case, an audio mixing device may be assigned to each FIR filter device, and thus each FIR filter device may be connected to an audio mixing device assigned thereto. A signal processing device is arranged in parallel with all FIR filter devices, and likewise connected to the audio mixing devices assigned to the FIR filter devices. The method may thus also be applied using one (single) signal processing device and a plurality of FIR filter devices; the change in the FIR coefficients of the FIR filter device that takes place according to the invention may take place simultaneously or temporally staggered. Naturally, as will become apparent in the following, the method may also be applied using one (single) FIR filter device and a plurality of signal processing devices.

If the method is applied using a plurality of FIR filter devices connected in parallel and audio mixing devices respectively assigned thereto, a further audio mixing device connected upstream from the signal processing device may be used, via which, while the method is carried out using a particular FIR filter device, audio signals assigned to the remaining FIR filter devices can be mixed in, in such a way that a listener does not perceive or barely perceives the morphing process (that is currently being carried out).

According to the method, the energy, in particular the volume, of the audio signal coming from the audio mixing device while or after the morphing process is carried out may be changed, in the context of the application of the first transfer function, from the energy of the audio signal coming from the FIR filter device to the energy of the audio signal coming from the signal processing device. In this way, a measure is provided that makes it possible for the morphing process to be imperceptible or barely perceptible to a listener.

According to the method, the second transfer function may only be carried out after a particular waiting time or time period, for example one second, after the completion of the application of the first transfer function, in other words only when the first transfer function is fully complete. In this way too, a measure is provided that makes it possible for the morphing process to be imperceptible or barely perceptible to a listener by way of undesired interference signals. The waiting time after which the second transfer function is applied may be determined on the basis of the length of the FIR filter device and thus tuned to the "configuration" of the FIR filter device as provided by the length of the FIR filter device or of the FIR coefficients. The waiting time is typically not shorter than the length of the FIR filter device.

According to the method, a plurality of different signal processing devices may be available, it being possible for the selection as to which signal processing device is used in the context of the application of the first and second transfer function to be made on the basis of at least one audio signal parameter that describes the acoustic properties of the audio signal. The determination of audio signal parameters of this type, which forms the basis for the selection of a particular signal processing device, can take place by way of audio signal analysis parameters. The selection as to which signal processing device is used in the context of the application of the first and second transfer function may also be made on the basis of the associated energy level or psychoacoustic level, or the amplitude and frequency range, of the signal processing devices available for selection, it being expedient to select a signal processing device having a level or an amplitude or frequency range that is similar (or as similar as possible) to that of the FIR filter device.

Under particular conditions, morphing processes of a plurality of FIR filter devices may be carried out simultaneously by way of one (single) signal processing device. In this case, weighted inputs of the FIR filter devices can be supplied to the or an audio mixing device upstream from the signal processing device and onward to the signal processing device. The output of the signal processing device is connected to audio mixing devices downstream from the signal processing device; the output of the signal processing device can accordingly be supplied to audio mixing devices downstream from the signal processing device, in particular distributed over audio mixing devices downstream from the signal processing device.

As mentioned above, according to the method, for example an amplification device or an IIR filter device may be used as a signal processing device. The selection as to whether an amplification device or an HR filter device is used as a signal processing device may be made as a function of the bandwidth (frequency bandwidth) of the audio signal. In particular, for audio signals having a bandwidth above a boundary bandwidth, for example in a range between 20 and 100 Hz or higher, an amplification device may be used as a signal processing device, and for audio signals having a bandwidth below a boundary bandwidth, for example in a range between 20 and 100 Hz or higher, an HR filter device may be used as a signal processing device. The selection as to which signal processing device is used may also be made while taking account of the state of the FIR filter device before and/or after the morphing process.

If an amplification device is used as a signal processing device, the power, in particular the gain, of the amplification device may be set to a value that for example (substantially) corresponds to the L2 standard for the impulse response of the FIR filter device, or the power, in particular the gain, may be set to a value that corresponds to an average of the impulse response of the FIR filter device before the change in the FIR coefficients or to an average of the impulse response of the FIR filter device after the change in the FIR coefficients. In this way, the power requirement of the amplification device can be restricted and the efficiency of the method improved.

Alongside the method, the invention relates to a device for carrying out a morphing process. The device is distinguished by an FIR filter device comprising an FIR algorithm comprising a plurality of FIR coefficients, at least one signal processing device connected in parallel with said device, for example an amplification device or an IIR filter device, at least one audio mixing device, which is connected to respective outputs of the FIR filter device and of the signal processing device, and a morphing device, which is set up to control a morphing process in accordance with the described method. All statements in connection with the method apply analogously to the device.

As functional components that cooperate to carry out a morphing process, the device may comprise the following devices, in each case implemented in hardware and/or in software:
- at least one acoustic audio output device, which comprises at least one acoustic audio output element, for example a loudspeaker element, and which is set up to output audio signals into an interior,
- at least one audio mixing device,
- an FIR filter device, which is connected between the audio signal source device and the audio mixing device and which comprises a data storage device, in which an FIR algorithm having a particular number of FIR coefficients is stored,
- at least one signal processing device connected in parallel with the FIR filter device, in other words in general a device that has less computational power and/or less memory than the FIR filter device, in particular an amplification device or an IIR filter device,
- a morphing device, which is set up to carry out a morphing process according to the invention that is carried out by means of the device.

The device may be used in various audio output devices; merely by way of example, reference may be made to the field of multimedia output devices for the field of home technology (home theater) or for the field of motor vehicle technology.

The invention thus also relates to a motor vehicle comprising a device of this type for carrying out morphing processes. All statements in connection with the device and the method apply analogously to the motor vehicle.

Figure 3:
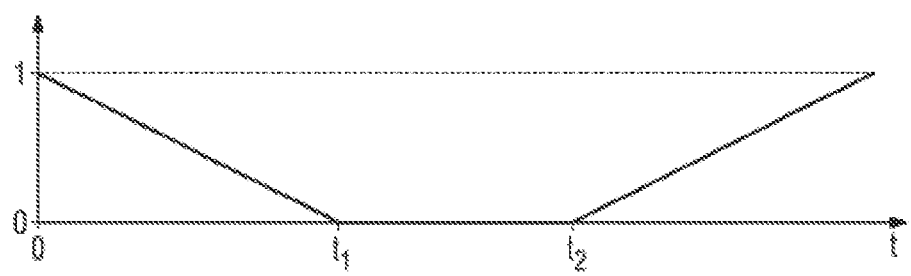

The invention is described in greater details by way of embodiments in the drawings, in which:

FIG. 1, 2 are each a schematic drawing of a device for carrying out a morphing process according to an embodiment; and FIG. 3, 4 are each a schematic drawing of transfer functions that may be applied in the context of a method according to an embodiment.

FIG. 1 is a schematic drawing of a device 1 for carrying out a morphing process according to a first embodiment. In a morphing process, at least one output parameter relating to the output of an audio signal outputted via an audio output device 3 is changed. By way of output parameters of this type, output settings of the audio output device 3 are defined in such a way that, in the context of carrying out a morphing process, corresponding output settings of the audio output device 3 are also changed.

The device 1 may be installed on or in an article 9 having an interior 10. The article 9 may for example be a motor vehicle, and the interior may accordingly be a passenger compartment of the motor vehicle. However, it would also be conceivable to install the device 1 in another article 9, for example in a multimedia device (home theater).

The device 1 comprises various functional components that cooperate to carry out a morphing process and that each comprise devices implemented in hardware and/or in software.

As a functional component of this type, the device 1 comprises an audio output device 3, which comprises at least one acoustic audio output element 2, for example a loudspeaker element, and which is set up to output audio signals, for example into the interior 10. The audio output device 3 may be a multichannel audio output device that has a plurality of, in other words at least two, acoustic audio output elements 2.

As a further functional component, the device 1 comprises an audio mixing device 4 upstream from the audio output element 2.

As a further functional component, the device 1 comprises an FIR filter device 5 connected between an audio signal source device 6 and the audio mixing device 4. The FIR filter device 5 comprises a data storage device (not shown), in which an FIR algorithm having a particular number of FIR coefficients is stored.

As a further functional component, the device 1 comprises a signal processing device 7 connected in parallel with the FIR filter device 5. The signal processing device 7 is generally a device that has less computational power and/or less memory than the FIR filter device 5.

For example, the signal processing device 7 may be an amplified device or an HR filter device.

The audio mixing device 4, the FIR filter device 5 and the signal processing device 7 may form a morphing device 8 of the device 1.

A morphing process carried out by means of the device 1 takes place in accordance with the method described in the following for carrying out a morphing process.

In a first step of the method, an audio signal, for example a piece of music, provided by the audio signal source device 6 is supplied to the audio mixing device 4 via the FIR filter device 5 comprising a plurality of FIR coefficients (filter coefficients). Thus, in the first step, an audio signal provided by the audio signal source device 6 is supplied to the audio mixing device 4 via the FIR filter device 5, In the first step, the audio signal provided by the audio signal source device 6 is supplied to the audio mixing device 4 100%, in other words exclusively or entirely, via the FIR filter device 5.

In a second step of the method, a first transfer function is applied, according to which the supply of the audio signal via the FIR filter device 5 is gradually reduced from 100% to 0% and the supply of the audio signal via the signal processing device 7 connected in parallel with the FIR filter device 5 is conversely gradually increased from 0% to 100%. At the start of the second step, the audio signal is thus supplied to the audio mixing device 4 100% via the FIR filter device 5, and at the end of the second step, the audio signal is thus supplied to the audio mixing device 4 100% via the signal processing device 7. Between the start and end of the second step, the audio signal is supplied both via the FIR filter device 5 and via the signal processing device 7, at particular, temporally varying percentage proportions. The respective percentage proportions are determined by the measure, defined by the first transfer function, whereby the supply of the audio signal to the audio mixing device 4 via the FIR filter device 5 is gradually reduced from 100% to 0% and the supply of the audio signal to the audio mixing device 4 via the signal processing device 7 is conversely gradually increased from 0% to 100%. A linear or non-linear function may be used as a first transfer function. The reduction and increase respectively in the supply of the audio signal via the FIR filter device 5 and via the signal processing device 7 may thus take place linearly or non-linearly.

In a third step of the method, at least some of the FIR coefficients of the FIR filter device 5 are changed, in particular switched, while supplying the audio signal via the signal processing device 7. The change in the FIR coefficients of the FIR filter device 5 takes place while the audio signal is being supplied to the audio mixing device 4 via the signal processing device 7. The FIR coefficients of the FIR filter device 5 are thus changed when the audio signal is being supplied to the audio mixing device 4 via the signal processing device 7 rather than via the FIR filter device 5.

The change in at least some of the FIR coefficients may take place by loading or reloading FIR coefficients from a storage device (not shown), in particular a non-volatile data storage device, for example a flash memory device, or by switching the FIR coefficients, in particular of an FIR coefficient set comprising a plurality or all of the FIR coefficients to be changed, for FIR filter coefficients stored in advance in a storage device, in particular a non-volatile data storage device, in particular for an FIR coefficient set comprising a plurality or all of the FIR coefficients to be changed. The change in at least some of the FIR coefficients typically only occurs once the first transfer function is fully completed, in other words once the audio signal is being supplied to the audio mixing device 4 entirely via the signal processing device 7.

During the change in at least some of the FIR coefficients, in some circumstances a temporary interruption to the (real-time) processing of the provided audio signal may occur. The interruption to the (real-time) processing of the provided audio signal, if it occurs, typically only takes place in the FIR filter device 5, and not in the signal processing device 7. If a corresponding interruption to the (real-time) processing of the provided audio signal occurs, it may be advisable also to empty the delay line of the FIR filter device 5, so as to avoid reproduction of the signal that was stored in the delay line, before the interruption to the real-time processing of the provided audio signal, once the interruption to the (real-time) processing of the provided audio signal is ended and the (real-time) processing of the provided audio signal is resumed.

In a fourth step following the third step, a second transfer function (reverse transfer function) is applied, according to which the supply of the audio signal via the signal processing device 7 is gradually reduced from 100% to 0% and the supply of the audio signal via the FIR filter device 5 is conversely gradually increased from 0% to 100%, wherein the audio signal is (thenceforth) supplied via the FIR filter device 5 on the basis of the changed FIR coefficients of the FIR filter device 5. At the start of the fourth step, the audio signal is supplied to the audio mixing device 4 100% via the signal processing device 7, and at the end of the fourth step, the audio signal is (again) supplied to the audio mixing device 4 100% via the FIR filter device 5. Between the start and end of the fourth step, the audio signal is supplied both via the signal processing device 7 and via the FIR filter device 5, at particular, temporally varying percentage proportions. The respective percentage proportions are determined by the measure, defined by the second transfer function, whereby the supply of the audio signal to the audio mixing device 4 via the signal processing device 7 is gradually reduced from 100% to 0% and the supply of the audio signal to the audio mixing device 4 via the FIR filter device 5 is conversely gradually increased from 0% to 100%. A linear or non-linear function may be used as the second transfer function.

The method is implemented by way of the morphing device 8, which is equipped with suitable morphing algorithms and implemented in hardware and/or in software, as a hardware and/or software component of the audio output device 3.

In the context of the method, the energy, in particular the volume, of the audio signal coming from the audio mixing device 4 while or after the morphing process is carried out may be changed, in the context of the application of the first transfer function, from the energy of the audio signal coming from the FIR filter device 5 to the energy of the audio signal coming from the signal processing device 7. In this way, a measure is provided that makes it possible for the morphing process to be imperceptible or barely perceptible to a listener.

In the context of the method, the second transfer function may only be carried out after a particular waiting time or time period, for example one second, after the completion of the application of the first transfer function. In this way too, a measure is provided that makes it possible for the morphing process to be imperceptible or barely perceptible to a listener. The waiting time after which the second transfer function is applied may be determined on the basis of the length of the FIR filter device 5 and thus tuned to the "configuration" of the FIR filter device 5 as provided by the length of the FIR filter device 5 or of the FIR coefficients. The waiting time is typically not shorter than the length of the FIR filter device 5.

As mentioned, the signal processing device 7 may be an amplification device or an IIR filter device. The selection as to whether an amplification device or an IIR filter device is used as a signal processing device 7 may be made as a function of the bandwidth (frequency bandwidth) of the audio signal. In particular, for audio signals having a bandwidth above a boundary bandwidth, for example in a range between 20 and 100 Hz or higher, an amplification device may be used as a signal processing device 7, and for audio signals having a bandwidth below a boundary bandwidth, for example in a range between 20 and 100 Hz or higher, an IIR filter device may be used as a signal processing device 7.

If an amplification device is used as a signal processing device 7, the power, in particular the gain, of the amplification device may be set to a value that for example (substantially) corresponds to the L2 standard for the impulse response of the FIR filter device 5, or the power, in particular the gain, may be set to a value that corresponds to an average of the impulse response of the FIR filter device 5 before the change in the FIR coefficients 5 or to an average of the impulse response of the FIR filter device 5 after the change in the FIR coefficients. In this way, the power requirement of the amplification device can be restricted and the efficiency of the method improved.

The parameters applied in the context of applying the reverse transfer function (cf. fourth step) may take place as a function of properties of the FIR filter device to be morphed. For example, it is possible for the response properties, in particular the magnitude response, of the signal processing device, for example an IIR filter device, to be adapted to or aligned with the response properties, in particular the magnitude response, of the FIR filter device.

Figure 2:
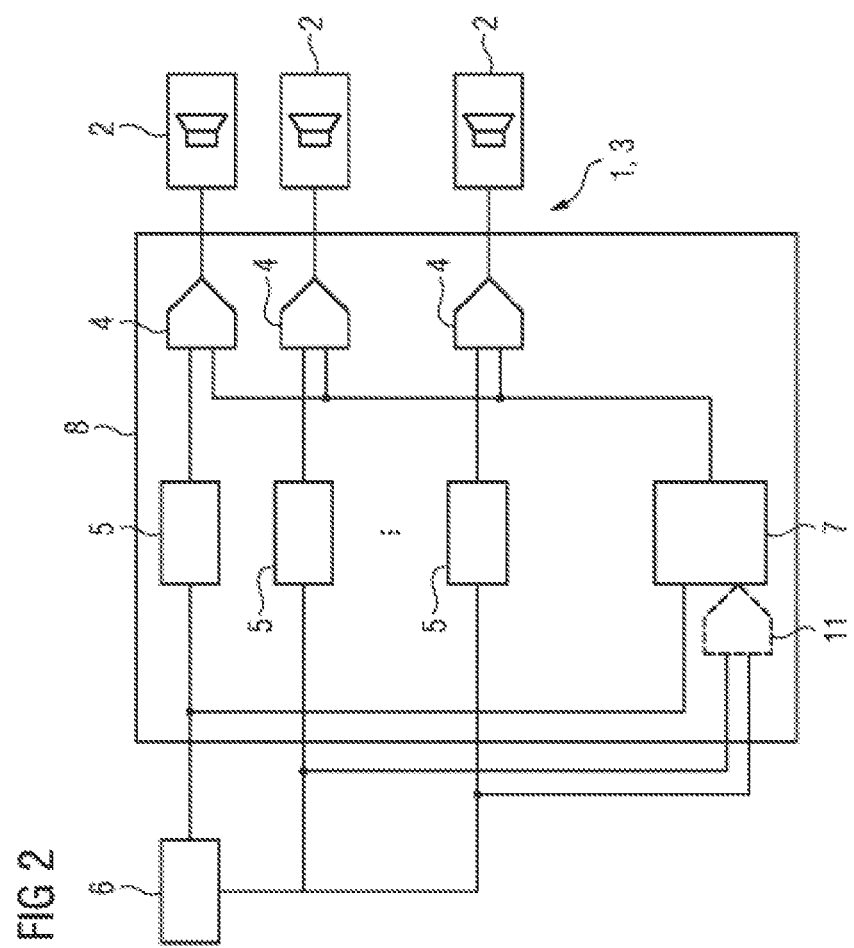

FIG. 2 is a schematic drawing of a device 1 for carrying out a morphing according to a further embodiment.

From FIG. 2, it can be seen that the principle described in connection with the embodiment shown in FIG. 1 is also applicable to a device 1 having a plurality of FIR filter devices 5 connected in parallel and audio mixing devices 4 respectively assigned thereto; each of the FIR filter devices 5 shown in FIG. 2 is connected to an audio mixing device 4 assigned thereto. A signal processing device 7 is arranged in parallel with all FIR filter devices 5, and likewise connected to the audio mixing devices 4 assigned to the FIR filter devices 5. A further audio mixing device 11 upstream from the signal processing device 7 is shown in dashed lines because it is optional. Via the further audio mixing device 11, while the method is carried out using a particular FIR filter device 5, audio signals assigned to the remaining FIR filter devices 5 can be mixed in, in such a way that a listener does not perceive or barely perceives the morphing process (that is currently being carried out).

The described method may thus also be implemented using one (single) signal processing device 7 and a plurality of FIR filter devices 5. The change in the FIR coefficients of the FIR filter device 5 that takes place according to the invention may take place simultaneously or temporally staggered.

Under particular conditions, morphing processes of a plurality of FIR filter devices 5 may be carried out simultaneously by way of one (single) signal processing device 7. In this case, weighted inputs of the FIR filter devices 5 can be supplied to the further audio mixing device 11 upstream from the signal processing device 7 and onward to the signal processing device 7. The output of the signal processing device 7 is connected to audio mixing devices 4 downstream from the signal processing device 7, in such a way that the output of the signal processing device 7 can be supplied to the audio mixing devices 4, in particular distributed over the downstream audio mixing devices 4.

Figure 4:
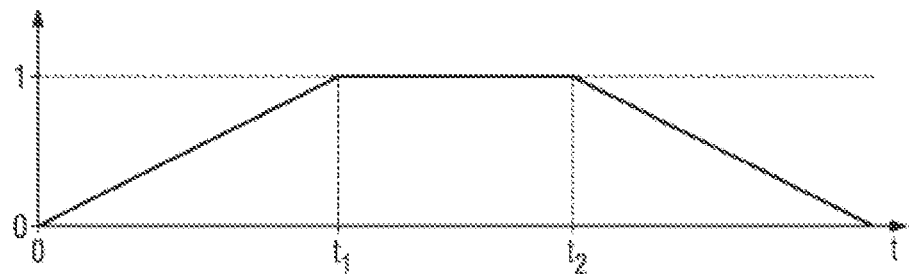

FIG. 3, 4 are each a schematic drawing of a transfer function applicable in the context of a method according to an embodiment. FIG. 3 shows an example of a graph of a first transfer function; FIG. 4 shows an example of a graph of a second transfer function.

The transfer functions are each shown in an x-y graph, the x-axis showing the time axis and the y-axis showing the degree to which the audio signal is supplied to the audio mixing device 4 via the FIR filter device 5 (FIG. 3) and via a signal processing device 7 (FIG. 4); a value of "0" shows that the audio signal is not being supplied via the FIR filter device 5 or the signal processing device 7 respectively, while a value of "1" shows that the audio signal is being supplied completely via the FIR filter device 5 or the signal processing device 7 respectively.

From the time axis, it can be seen that at time t0 the audio signal is supplied exclusively via the FIR filter device 5. As a result of application of the first transfer function, the graph for the FIR filter device 5 in FIG. 3 decreases, while the graph for the signal processing device 7 in FIG. 4 increases with respect thereto.

At time $t_1$, the audio signal is supplied exclusively via the signal processing device 7. In the interval between time $t_1$ and time $t_2$, there is a waiting time selected as a function of the length of the FIR filter device 7. The waiting time is typically not shorter than the length of the FIR filter device 5.

At time $t_2$, as a result of application of the second transfer function, the graph for the signal processing device 7 in FIG. 4 decreases, while the graph for the FIR filter device 5 in FIG. 3 increases with respect thereto.

For all embodiments, it is the case that, in the context of the method, a plurality of different signal processing devices 7 may be available. The selection as to which signal processing device 7 [ . . . ] in the context of applying the first from the time axis, it can be seen that at time to the audio signal is supplied exclusively via the FIR filter device 5. As a result of application of the first transfer function, the graph for the FIR filter device 5 in FIG. 3 decreases, while the graph for the signal processing device 7 in FIG. 4 increases with respect thereto.

At time $t_1$, the audio signal is supplied exclusively via the signal processing device 7. In the interval between time $t_1$ and time $t_2$, there is a waiting time selected as a function of the length of the FIR filter device 7. The waiting time is typically not shorter than the length of the FIR filter device 5.

At time $t_2$, as a result of application of the second transfer function, the graph for the signal processing device 7 in FIG. 4 decreases, while the graph for the FIR filter device 5 in FIG. 3 increases with respect thereto.

For all embodiments, it is the case that, in the context of the method, a plurality of different signal processing devices 7 may be available. The selection as to which signal processing device 7 is used in the context of applying the first and second transfer function may be made on the basis of at least one audio signal parameter, in particular the frequency progression of the audio signal, that describes the acoustic properties of the audio signal. The determination of audio signal parameters of this type, which forms the basis for the selection of a particular signal processing device 7, can take place by way of audio signal analysis parameters. The selection as to which signal processing device 7 is used in the context of the application of the first and second transfer function may also be made on the basis of the associated energy level or psychoacoustic level, or the amplitude and frequency range, of the signal processing devices 7 available for selection, it being expedient to select a signal processing device 7 having a level or an amplitude or frequency range that is similar (or as similar as possible) to that of the FIR filter device 5.

The invention claimed is:

1. Method for carrying out a morphing process, wherein at least one output parameter relating to the output of an audio signal, via an audio output device is changed, comprising:
   supplying an audio signal provided by an audio signal source device to at least one audio mixing device via at least one FIR filter device comprising a plurality of FIR coefficients, wherein 100% of the audio signal is supplied to the audio mixing device via the FIR filter device,
   applying a first transfer function, according to which the supply of the audio signal via the FIR filter device is gradually reduced from 100% to 0% and the supply of the audio signal via a signal processing device connected in parallel with the FIR filter device is conversely gradually increased from 0% to 100%,
   changing at least some of the FIR coefficients of the FIR filter device while supplying the audio signal via the signal processing device, applying a second transfer function, according to which the supply of the audio signal via the signal processing device is gradually reduced from 100% to 0% and the supply of the audio signal via the FIR filter device is conversely gradually increased from 0% to 100%, wherein the audio signal is supplied via the FIR filter device on the basis of the changed FIR coefficients of the FIR filter device, wherein an amplification device or an IIR filter device is used as a signal processing device, and wherein for audio signals having a bandwidth above a boundary bandwidth, an amplification device is used as a signal processing device, and for audio signals having a bandwidth below a boundary bandwidth, an IIR filter device is used as a signal processing device.

2. Method according to claim 1, wherein an energy of the audio signal coming from the audio mixing device while or after the morphing process is carried out is changed, in the context of the application of the first transfer function, from the energy of the audio signal coming from the FIR filter device to the energy of the audio signal coming from the signal processing device.

3. Method according to claim 1, wherein a linear or a non-linear function is used as a first and/or second transfer function.

4. Method according to claim 1, wherein the second transfer function is only carried out after a particular waiting time or time period after the completion of the application of the first transfer function.

5. Method according to claim 4, wherein the waiting time after which the second transfer function is applied is determined on the basis of the length of the FIR filter device.

6. Method according to claim 1, wherein the change in at least some of the FIR coefficients takes place by loading FIR coefficients from a storage device, or by switching the FIR coefficients for FIR filter coefficients stored in advance in a storage device.

7. Method according to claim 1, wherein a plurality of different signal processing devices are available, the selection as to which signal processing device is used in the context of applying the first and second transfer function being made on the basis of at least one audio signal parameter that describes the acoustic properties of the audio signal.

8. Method according to claim 1, wherein a device having less computational power and/or less storage than the FIR filter device is used as a signal processing device.

9. Method for carrying out a morphing process, wherein at least one output parameter relating to the output of an audio signal, via an audio output device is changed, comprising:

supplying an audio signal provided by an audio signal source device to at least one audio mixing device via at least one FIR filter device comprising a plurality of FIR coefficients, wherein 100% of the audio signal is supplied to the audio mixing device via the FIR filter device, applying a first transfer function, according to which the supply of the audio signal via the FIR filter device is gradually reduced from 100% to 0% and the supply of the audio signal via a signal processing device connected in parallel with the FIR filter device is conversely gradually increased from 0% to 100%, changing at least some of the FIR coefficients of the FIR filter device while supplying the audio signal via the signal processing device, applying a second transfer function, according to which the supply of the audio signal via the signal processing device is gradually reduced from 100% to 0% and the supply of the audio signal via the FIR filter device is conversely gradually increased from 0% to 100%, wherein the audio signal is supplied via the FIR filter device on the basis of the changed FIR coefficients of the FIR filter device, wherein if an amplification device is used as a signal processing device, the power of the amplification device is set to a value that corresponds to the L2 standard for the impulse response of the FIR filter device, or the power is set to a value that corresponds to an average of the impulse response of the FIR filter device before the change in the FIR coefficients of the FIR filter device or to an average of the impulse response of the FIR filter device after the change in the FIR coefficients.

10. Device for carrying out a morphing process, comprising:

at least one FIR filter device, at least one signal processing device connected in parallel therewith, at least one audio mixing device, which is connected to respective outputs of the FIR filter device and of the signal processing device, and a morphing device, which is set up to control a morphing process in accordance with the method according to claim 1.

11. Motor vehicle, comprising at least one device according to claim 10.

* * * * *